United States Patent [19]  [11] 4,093,985
Das  [45] June 6, 1978

[54] MEMORY SPARING ARRANGEMENT
[75] Inventor: Santanu Das, Stamford, Conn.
[73] Assignee: North Electric Company, Galion, Ohio
[21] Appl. No.: 739,356
[22] Filed: Nov. 5, 1976
[51] Int. Cl.² .................. G06F 11/00; G06F 13/00
[52] U.S. Cl. .................................................. 364/200
[58] Field of Search ........ 364/200, 900, 200 MS File, 364/900 MS File

[56] References Cited
U.S. PATENT DOCUMENTS

| | | | |
|---|---|---|---|
| 3,436,734 | 4/1969 | Pomerene et al. | 364/200 |
| 3,517,171 | 6/1970 | Avizienis | 364/200 |
| 3,633,175 | 1/1972 | Harper | 364/200 |
| 3,668,644 | 6/1972 | Looschen | 364/200 |
| 3,800,294 | 3/1974 | Lawlor | 364/200 |
| 3,803,560 | 4/1974 | DeVoy et al. | 364/200 |
| 3,866,182 | 2/1975 | Yamada et al. | 364/200 |
| 3,889,237 | 6/1975 | Alferness et al. | 364/200 |
| 3,895,353 | 7/1975 | Dalton | 364/200 |
| 3,905,023 | 9/1975 | Perpligia et al. | 364/200 |
| 3,921,150 | 11/1975 | Scheuneman | 364/900 |
| 3,934,227 | 1/1976 | Worst et al. | 364/200 |
| 3,949,372 | 4/1976 | Brioschi | 364/200 |
| 4,010,450 | 3/1977 | Porter et al. | 364/200 |

Primary Examiner—Mark E. Nusbaum
Assistant Examiner—Jan E. Rhoads
Attorney, Agent, or Firm—Charles M. Hutchins

[57] ABSTRACT

A digital data processing arrangement for providing automatic substitution of a spare memory module for a malfunctioning portion of the system memory is disclosed. The substitution takes place in a manner transparent to the software programs being run in the processing system. The system memory is organized as a plurality of memory modules, each having an identical number of individually addressable words. A particular module is enabled on receipt of an appropriate signal via a dedicated lead from the system processor unit, while a particular word within that module is specified by an address received via an address bus running to address decoder units at all modules. When the error detection and identification routines of the system processor determine that a particular module is malfunctioning, a hardware register and accompanying comparison logic are arranged such that a spare module is accessed whenever the particular malfunctioning module is subsequently addressed. The approach does not diminish the available system memory address range after spare module substitution. Additionally, no memory reconfiguration is required after spare module substitution except for loading of the spare module itself whenever program memory substitution is involved.

4 Claims, 3 Drawing Figures

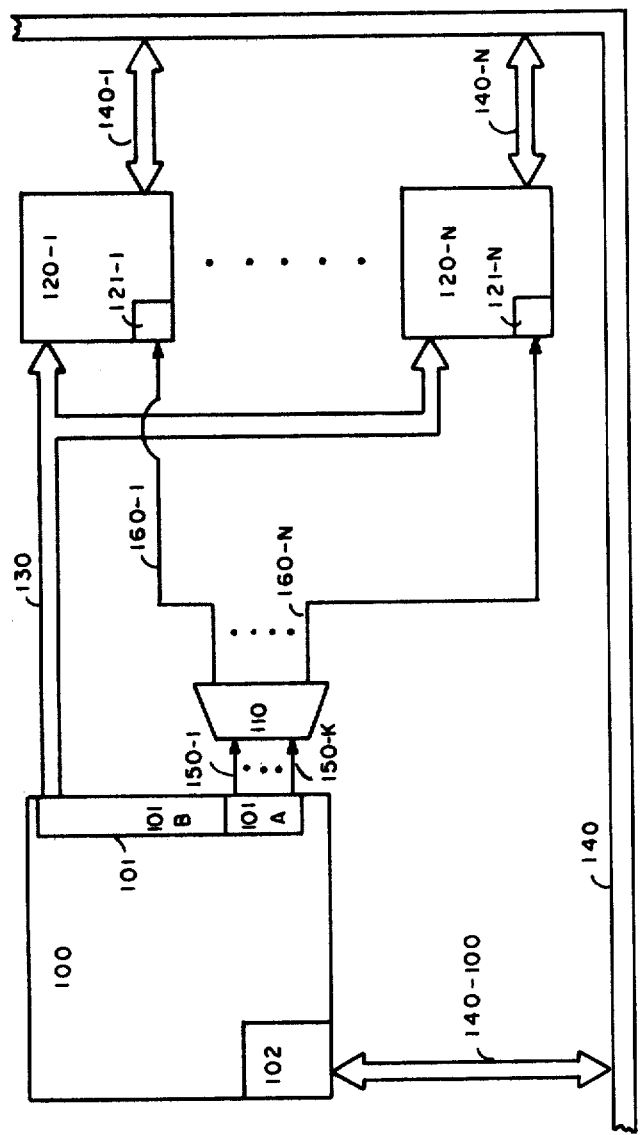

MEMORY SPARING ARRANGEMENT

BACKGROUND OF THE INVENTION

1. Field of the Invention

The invention relates generally to fault-tolerant digital data processing memory systems and relates more particularly to arrangements for providing automatic sparing of memory modules in said systems.

2. Description of the Prior Art

The provision of fault tolerance in computer memory systems via provision of redundant elements has evolved from cumbersome manual replacement approaches to more automatic substitution techniques. This evolution also has progressed from a provision of at least one redundant component for every on-line replaceable element to a so-called N + 1 redundancy, wherein only one spare is provided for a set (N) of elements, said spare being substitutable for any element of the set.

To be truly automatic, the ideal memory substitution, or so-called sparing arrangement, should be accomplished such that, after the substitution, no changes are required in running the normally operational software programs in the digital data processing system incorporating the memory. Such a characteristic is known as software transparency.

One representative prior art approach to providing spare memory substitution is set forth in U.S. Pat. No. 3,803,560 — De Voy et al., issued Jan. 3, 1973. In the De Voy method, after error detection and location of a defective module, a spare module is activated and the entire memory subsystem is reconfigured into a contiguous address space. The reconfiguration results in software transparency, but the reconfiguration approach requires rather complex circuitry provided with every system memory module, since the memory configuration utilizes a ripple-through module enabling technique wherein circuitry local to each module modifies an enable address for transmission to succeeding modules.

Another representative sparing arrangement is taught in U.S. Pat. No. 3,633,175 — Harper, issued Jan. 4, 1972. Harper teaches a defect-tolerant memory system with means for substituting spare memory areas for defective words. The approach is extendable to substitution of multi-word modules, but has the disadvantage of requiring a double-memory-read per fetch operation, since a content-addressable memory is consulted for every memory address to determine if that address points to a defective area of memory. Additionally, with the Harper approach, the spare memory takes up a portion of the available system address range.

Still another prior art approach is represented by U.S. Pat. No. 3,517,171 — Avizienis, issued June 23, 1970, which teaches so-called power-switching of spare memory modules. Upon location of a faulty module, power is removed from the faulty unit and a spare is automatically cut in, in place of the faulty unit. This power switching approach is more complicated than a logic switching approach and has the added economic disadvantages of requiring complex transfer gating circuitry and one spare memory module for each main memory module.

Hence, there is seen a need to provide a fault-tolerant, digital data processing system memory in a relatively simple and inexpensive manner which will provide for automatic sparing of at least one spare memory module wherein the automatic sparing can be accomplished with software transparency and without decreasing the system's usable address range.

SUMMARY OF THE INVENTION

It is an object of this invention to provide an automatic memory sparing arrangement that is transparent to the system software, has a minimum amount of redundancy, and is capable of operation without decreasing system memory.

It is another object of the invention to realize the memory module substitution in a simpler and more inexpensive manner than has heretofore been possible.

According to a further object of the invention, any spare memory module can be substituted for any of the plurality of on-line memory modules with no other required reconfiguration of the remaining on-line modules.

Yet another object of the invention is to provide for the capability of using the same substitution, or memory sparing, arrangement for both program memory and temporary, or scratch pad, memory modules in the same digital data processing system.

An automatic memory sparing arrangement is disclosed for use with a digital data processing system. The system memory is organized into a plurality of memory modules each with a plurality of individually addressable words. Additionally, the plurality of modules includes at least one spare module. The memory word address is comprised of a first portion designating which particular module contains a given word and a second portion designating which word in particular module is to be accessed. The first portion of the address is decoded at the processor, and a particular memory module is enabled on receipt of an appropriate signal via a dedicated path connecting that module to the processor's module selection means. The second portion of the memory word address is distributed from the processor to all memory modules via a common address bus and is then decoded locally at the enabled module in order to select the specific word addressed. The processor's module selection means includes an error indicator register activated in response to signals derived from the processor's memory error detection and identification routines. The error indicator register, in conjunction with accompanying comparison logic of the module selection means, is used to automatically indicate that a spare memory module is to be accessed whenever the first portion of a memory word address designates a module previously discovered to have been malfunctioning.

DRAWING

These and other objects and features of the invention will become apparent from a reading of the following detailed description of an illustrative embodiment taken in conjunction with the drawing in which:

FIG. 1A depicts a block of the major components of a typical digital data processing system of the prior art, FIG. 1B depicts a block diagram of the data processing system of FIG. 1A modified in accordance with the principles of the invention, and FIG. 2 sets forth pertinent details of module substitution control means arranged in accordance with the principles of the invention and shown functionally as block 170 in FIG. 1B.

DETAILED DESCRIPTION

Figure 1B:
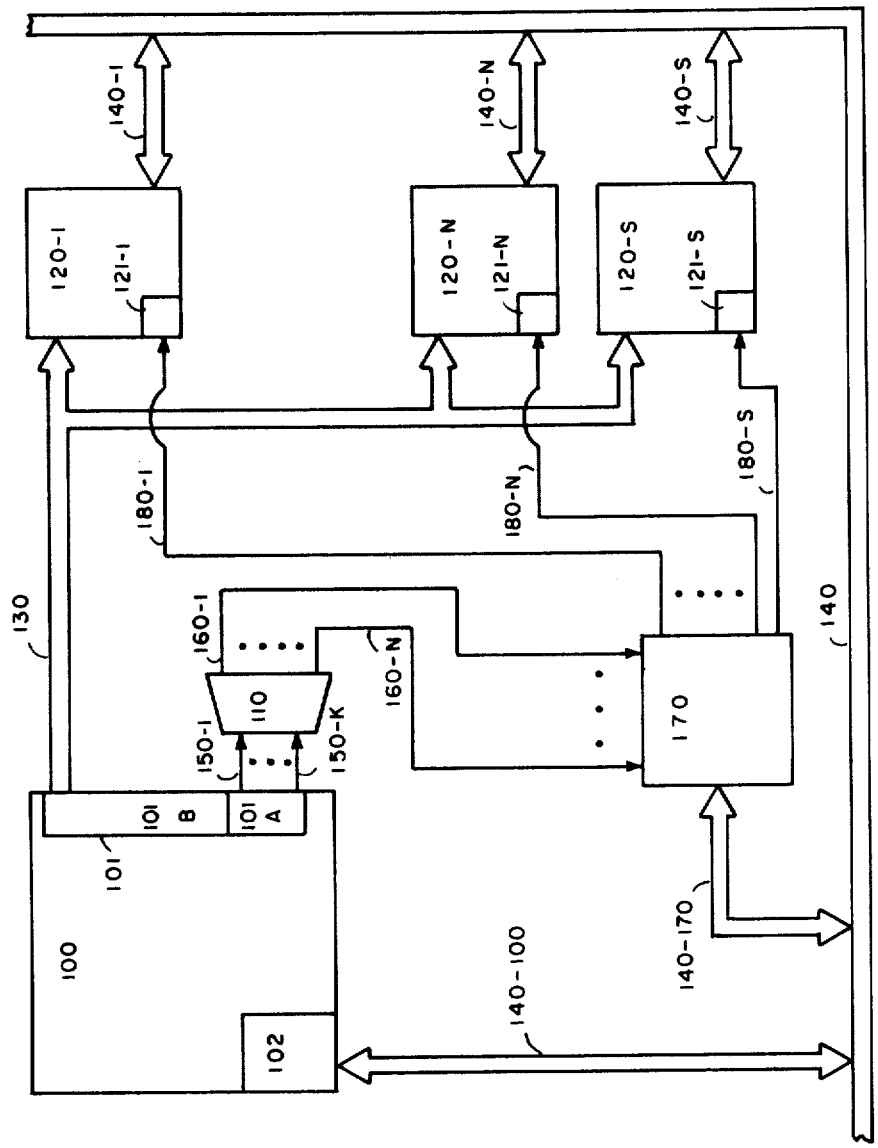

It should be noted, with reference to all the various figures of the drawing, that a series of dots between paths or functional components is used to indicate that intermediate paths or components are not shown. Additionally, solid double-sided paths are used to designate multiple-conductor busses such as address bus 130 of FIG. 1A, while single lines, such as 160-1 of FIG. 1A, are used to designate dedicated individual connections. Arrowheads are used per normal convention to indicate the direction of signal flow.

To demonstrate the ease of incorporating the principles of the instant invention into a prior art processing system, a prior art arrangement used in many existing digital data processing systems will be described in conjunction with FIG. 1A. As seen in FIG. 1A, the basic elements of the digital data processing system include a central processor unit 100, a plurality (N) of memory modules 120-1 through 120-N, an address bus 130, a bidirectional data bus 140, and peripheral module selection decoder 110.

Central processor unit (CPU) 100 of FIG. 1A includes means 101, for generating a memory address. A first predetermined portion of the generated memory address, 101A, is coupled via paths 150-1 through 150-K to selection decoder 110, which decodes the binary representation present on leads 150-1 through 150-K into a 1-of-N code at decoder outputs connected to paths 160-1 through 160-N. Paths 160-1 through 160-N, in turn, are respectively coupled to module enable means 121-1 through 121-N of memory modules 120-1 through 120-N. Also as shown in FIG. 1A, a second predetermined portion of the generated memory address, 101B, is transmitted to all memory modules 120-1 through 120-N via address bus 130. The particular module which has been enabled, according to a signal on one of the leads 160-1 through 160-N, will then decode said second predetermined portion of the generated memory address present on address bus 130, to determine the particular word within the particular module to be accessed. For drawing clarity, timing and control signal paths between CPU 100 and various peripheral elements have not been shown.

Additionally shown in FIG. 1A is bidirectional data bus 140 and its supplemental paths 140-100 and 140-1 through 140-N interconnecting CPU 100 with all memory modules. As is commonly known in the art, data presented to bus 140 from section 102 of CPU 100 may be written into a memory word selected as described hereinabove. Alternatively, on a read or fetch operation, the contents of a memory word, selected as described, may be passed to section 102 of CPU 100 via data bus 140.

All the components described thus far with reference to FIG. 1A are well-known in the art. For the sake of example only, and without limiting the principles of the invention, these components could be chosen from those described in the *Intel 8080 Microcomputer Systems User's Manual*, July 1975, available from Intel Corporation, 3065 Bowers Ave., Santa Clara, Calif. 95051. For example, CPU 100 of FIG. 2A could be the Intel 8080 microprocessor control unit, decoder 110 could be composed of one or more Intel 8205 chip select decoders and memory modules 120-1 through 120-N could comprise a mixture of Intel 8308 ROM's and Intel 8101-2 RAM's.

The prior art arrangement of FIG. 1A is shown modified according to the principles of the invention in FIG. 1B, wherein the prior art system is now rearranged to provide the desired automatic, software-transparent, memory sparing or substitution. Those components of FIG. 1B which are retained from the prior art arrangement of FIG. 1A are designated with the same reference numerals used in FIG. 1A.

As seen in FIG. 1B, CPU 100 is interconnected with a plurality of memory modules, 120-1 through 120-N, and with a spare memory module 120-S, all via address bus 130, bidirectional data bus 140 (and its adjunct paths 140-100 and 140-1 through 140-N and 140-S). Again a first predetermined portion of the memory address field is coupled to a decoder 110 via paths 150-1 through 150-K. However, unlike the prior art arrangement of FIG. 1A, FIG. 1B depicts the outputs of decoder 110 coupled to substitution control means 170 via paths 160-1 through 160-N. Substitution control means 170 has additional inputs coupled to CPU 100 via data bus 140 and its adjunct paths 140-100 and 140-170. The outputs of substitution control means 170 are then coupled to the module enabling means 121-1 through 121-N via paths 180-1 through 180-N. An additional output is coupled to the enabling means 121-S of spare module 120-S via path 180-S. Again, for the sake of drawing clarity, timing and control paths between CPU 100 and the various peripheral components are not shown.

As shown in FIG. 1B, decoder 110 and substitution control means 170 taken together comprise the module selection means for the system. Although decoder 110 and substitution control means 170 have been shown as separate from the central processor unit of the illustrative embodiment, it will be apparent to those skilled in the art that such components — i.e. the module selection means — could be incorporated into, and be an integrated part of, the central processor unit itself.

Figure 2:
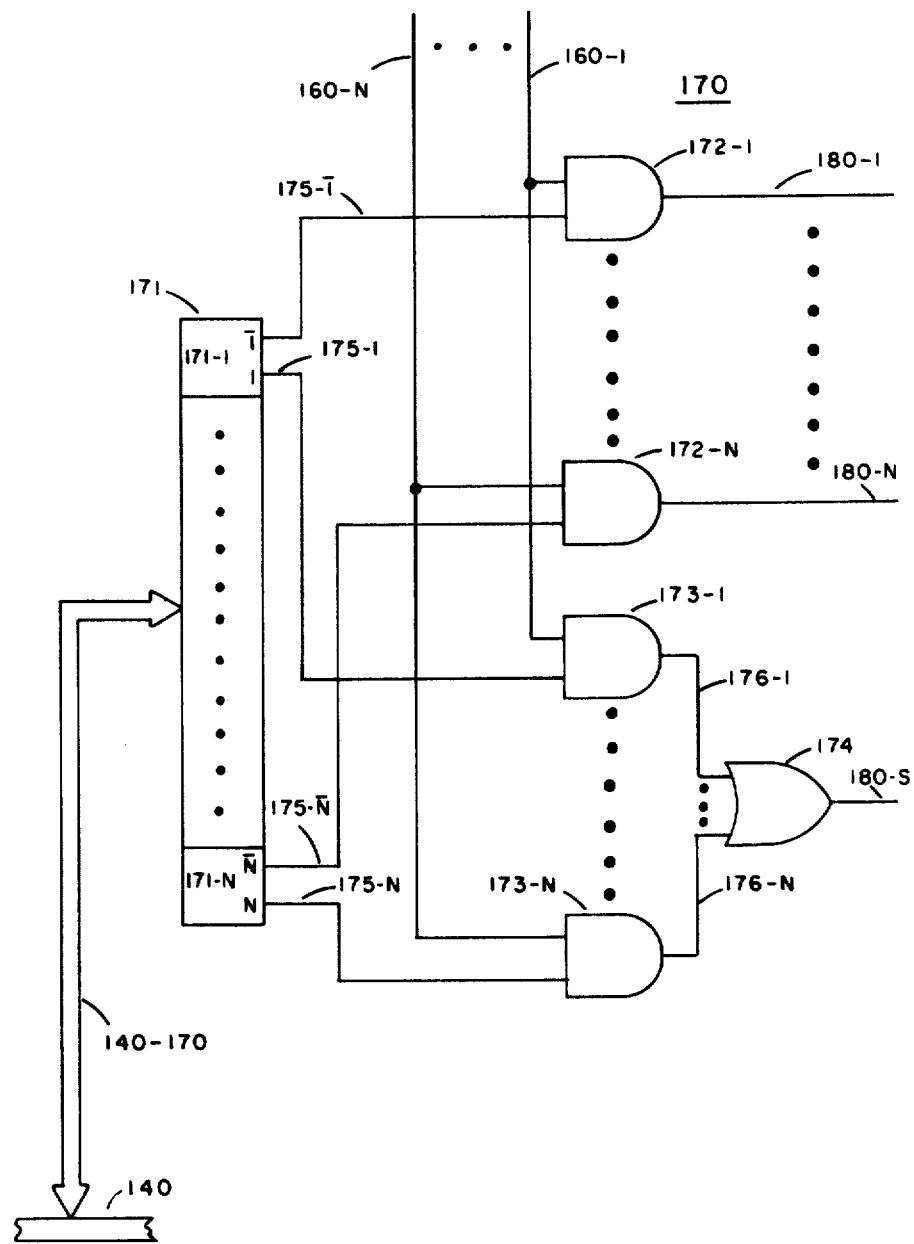

The details of an exemplary arrangement of the substitution control means 170 of FIG. 1B are set out in FIG. 2. Note that the inputs and outputs of substitution control means 170 are given the same reference numeral designations in FIG. 2 as were used in FIG. 1B. As shown in *FIG. 2*, data bus 140 is coupled via adjunct bus path 140-170 to the inputs of error indicator registor 171. Register 171 has N stages, or cells, 171-1 through 171-N, where N equals the number of normally on-line memory modules for the system. Each cell has complementary outputs 1, $\bar{1}$ through N, $\bar{N}$. Hence every cell could, for example, be comprised of a simple flip-flop circuit. As is well-known in the art, when one cell output is logically high, the complementary output of that cell is logically low, and vice versa.

As shown in FIG. 2, error indicator register outputs 1 through N are respectively coupled, via paths 175-1 through 175-N, to inputs of logical AND gates 173-1 through 173-N. Error indicator register outputs $\bar{1}$ through $\bar{N}$ are respectively coupled, via paths 175-$\bar{1}$ through 175-$\bar{N}$, to inputs of logical AND gates 172-1 through 172-N.

Also, as depicted in FIG. 2, outputs of decoder 110 of FIG. 1B appear on paths 160-1 through 160-N and are respectively coupled to second inputs of AND gates 172-1 through 172-N and are also respectively coupled to second inputs of AND gates 173-1 through 173-N.

The outputs of AND gates 172-1 through 172-N appear at paths 180-1 through 180-N, and, as shown in FIG. 1B, these outputs are respectively distributed to the module enabling means of module 120-1 through 120-N.

The outputs of AND gates 173-1 through 173-N are respectively coupled to inputs of logical OR gate 174 via paths 176-1 through 176-N. The output of OR gate 174 in turn is coupled via path 180-S to the enabling unit 121-S of spare module 120-S, as shown in FIG. 1B.

It should be noted, in conjunction with FIG. 2, that the data bus 140–170 is shown schematically as a solid arrow rather than depicting the individual leads of the data bus. It will be apparent to those of ordinary skill in the art that there are various means of controlling the states of the register cells 171-1 through 171-N from CPU of FIG. 1B via data bus 140. The simplest technique would be to assume that there are at least N bit-positions in the data bus 140. With such an assumption, each level of each data bus bit position would be respectively coupled to an associated register cell via suitable control logic. Alternatively, one could have register control means (not shown in the specific embodiment of FIG. 2) interposed between data bus 140 and register 171. In this approach, a binary representation of the register cell number to be set or cleared, along with the set or clear instruction itself, would be sent via the data bus to the interposed register control means. In any event, the precise method used for controlling register 171 of FIG. 2 by CPU 100 of FIG. 1B is not critical to the realization of the principles of the invention. Suffice it to say that CPU 100 controls the contents of the register 171 in any of a number of ways obvious to those of ordinary skill in the art, by passing a representation of the desired contents of register 171 to the substitution control means 170 via data bus 140.

An example of the memory sparing effected by the apparatus set forth hereinabove is best understood by the following description taken in conjunction with FIG. 1B and FIG. 2. First assume all memory modules of FIG. 1B are functioning properly, In this condition, the on-line modules are 120-1 through 120-N. Also, with all on-line modules functioning normally, all cells of error indicator register 171 (FIG. 2) have been conditioned by CPU 100 via data bus 140 to be in the cleared state — i.e. the outputs $\overline{1}$ through $\overline{N}$ are high, or logical ones.

Assume for this example that a read, or fetch, is required to obtain the contents of a system memory word. The address of the desired word is formed by CPU 100 (FIG. 1B) at address generating means 101. Further assume that the desired memory word is located in memory module 120-1 (FIG. 13).

The first predetermined portion of the address at 101A is passed via paths 150-1 through 150-K to decoder 110 (FIG. 1B). Decoder 110 converts the binary coded representation of the 101A portion of the address into a 1-of-N code, where N is an integer equal to the number of system on-line memory modules. Recall, for this example, that memory module 120-1 is being addressed. Hence a logical 1, or high state, is placed by decoder 110 on path 160-1, while paths 160-2 (not shown) through 160-N will be placed at logic 0.

The logic 1 present on path 160-1 is coupled to an input of substitution control means 170 of FIG. 1B. From FIG. 2 it is seen that path 160-1 is specifically applied to the inputs of AND gates 172-1 and 173-1. As mentioned previously in conjunction with FIG. 2, cell 171-1 of error identifier register 171 has its $\overline{1}$ output high and its 1 output low, since module 120-1 is functioning properly to this point. Hence the logic 1 from output $\overline{1}$ is coupled to a second input of AND gate 172-1 via path 175-$\overline{1}$, and a logic 0 is coupled to AND gate 173-1 via path 175-1 thereby inhibiting AND gate 173-1. Since both inputs to AND gate 172-1 are logical 1, the output of AND gate 172-1 is likewise forced to logical 1, thereby enabling memory module 120-1 (FIG. 1B) via path 180-1.

The second predetermined portion of the address at 101B (FIG. 1B) is presented to all memory modules via address bus 130. Module 120-1 is the only module enabled by the module selection means comprised of the combination of decoder 110 and substitution control means 170. Hence module 120-1 decodes the address field present on bus 130 and gates the contents of the selected word onto data bus 140 via adjunct bus path 140-1, thus returning the desired memory word contents to CPU 100. The normal memory fetch sequence is now completed.

Next, assume that in the course of system operation, memory module 120-1 (FIG. 1B) is discovered by CPU 100 to be malfunctioning. Such detection can be accomplished in any number of ways well-known in the art. For example, CPU 100 could perform a parity check over all data received from the system memory via data bus 140.

Upon finding the malfunction, CPU 100 (FIG. 1B), via its error control and spare switching software routine, sends a state control message to substitution control means 170 via data bus paths 140-100, 140, and 140-170. The state control message is received at the error indicator register 171 of FIG. 2, whereupon register cell 171-1 is set with its 1 output high and its $\overline{1}$ output low. All other cells of register 171 remain in the opposite state, with outputs $\overline{2}$ through $\overline{N}$ high and with outputs 2 through N low.

As of this point, automatic software-transparent spare switching will take place whenever module 120-1 (FIG. 1B) is addressed. This is due to the fact that AND gate 172-1 of FIG. 2 is now disabled by the low logic signal presented to it from output $\overline{1}$ via path 175-$\overline{1}$. Instead, AND gate 173-1 is now enabled whenever module 120-1 is addressed by virtue of the logically high signal at its inputs on paths 160-1 and 175-1. The resulting high output at AND gate 173-1 in turn enables OR gate 174, via path 176-1, to present a logically high output at path 180-S, which enables spare module 120-S (FIG. 1B).

Note that the above process takes place with no required software change in the programs of CPU 100. The same address fields are generated as if all normally online memory modules were functioning properly. The automatic spare switching then takes place via the hardware logic of substitution control means 170. No reconfiguration or other change in memory address range is required by the system program.

Although the above-described example was set forth with reference to automatic substitution for module 120-1 of FIG. 1B, it will be apparent to those of ordinary skill in the art that the logic arrangement described with reference to FIG. 2, functions similarly for substituting spare module 120-S for any one of the normally on-line modules 120-1 through 120-N of FIG. 1B. The choice is governed by the setting of the appropriate cell of error indicator register 171 of FIG. 2.

The hardware required to implement the memory sparing described hereinabove is seen to be relatively simple and inexpensive. To provide a sparing approach with one spare module, it is seen that, assuming N on-line modules, the approach requires 2 × N 2-input AND gates, 1 N-bit register, and 1 N-input OR gate, or equivalent.

It should be noted that the invention described herein has been illustrated with reference to a particular embodiment. It is to be understood that many details used to facilitate the description of such a particular embodiment are chosen for convenience only and without limitations on the scope of the invention. Other embodiments may be devised by those skilled in the art without departing from the scope and spirit of the invention. For example, as noted previously, the module selection means comprising decoder 110 and substitution control means 170 of FIG. 1B could be incorporated into the design of the CPU 100 itself rather than being added as external components. As a further alternative approach, it will be apparent to those skilled in the art that the logic arrangement of substitution control means 170 is obviously extendable for providing a plurality of automatically substituted spare modules. Accordingly, the invention is intended to be limited only by the scope and spirit of the appended claims.

What is claimed is:

1. A digital processor system comprising;
   memory means including a plurality of on-line memory modules and at least one spare memory module, each module having module enabling means and a plurality of individually-addressable words,
   a central processor unit (CPU), an address bus and a data bus, both interconnecting the CPU with each of the memory modules, and
   module selection means having first and second pluralities of inputs coupled to the CPU, a plurality of outputs, each coupled to a corresponding one of the module enabling means of the on-line and spare memory modules,
   the CPU including first partial address generation means coupled to the first plurality of module selection means inputs, the first partial address designating a particular memory module, second partial address generation means coupled to the address bus, the second partial address designating a particular memory word within a module, means for receiving over the data bus contents of a memory word specified by generated first and second partial addresses, error control means operative, in conjunction with said means for receiving, to detect any malfunctioning memory module and to generate data identifying a malfunctioning module for presentation to the second plurality of module selection means inputs,
   the module selection means including substitution control means operative in response to a first partial address received at the first plurality of inputs and the data received at the second plurality of inputs to substitute the designation of a spare memory module in place of the received first partial address whenever the first partial address designates an on-line memory module previously identified at the second plurality of inputs by the error control means.

2. The digital processor system of claim 1 wherein said substitution control means comprises;
   register means having inputs coupled to said second plurality of inputs to said module selection means and having a plurality of individually controllable cells equal in number to said plurality of on-line memory modules, each of said cells having a pair of complementary outputs,
   logic comparison means having inputs respectively coupled to each of said complementary outputs of said plurality of cells and to said first plurality of inputs to said module selection means, said logic comparison means having outputs respectively coupled to each of said outputs of said module selection means.

3. A digital processor system comprising;
   memory means including an integral number, N, of on-line memory modules and one spare memory module, each of the N+1 modules having module enabling means and a plurality of individually addressable words,
   a central processor unit (CPU), an address bus and a data bus, both interconnecting the CPU with each of the N+1 modules,
   a decoder having a plurality of inputs coupled to the CPU, and N outputs, the decoder being operative to convert binary coded information presented to the decoder inputs to a 1-of-N code at the decoder outputs, and
   substitution control means having a first plurality of N inputs respectively coupled to the N decoder outputs, a second plurality of inputs coupled to the CPU, and N+1 outputs respectively coupled to corresponding module enabling means of the N+1 memory modules,
   the CPU including means for generating and coupling to the decoder inputs a first portion of a binary coded memory word address designating a particular memory module, means for generating and coupling to the address bus a second portion of a binary coded memory word address designating a particular memory word within a module, means for receiving from the data bus contents of a memory word specified by generated first and second address portions, error control means operative, in conjunction with said means for receiving, to detect any malfunctioning memory module and to generate data identifying a malfunctioning module for presentation to the second plurality of substitution control means inputs,
   the substitution control means operative as connected to alter the 1-of-N code appearing at the decoder outputs to indicate instead the selection of the spare module whenever the 1-of-N code designates a malfunctioning on-line module previously identified at the second plurality of substitution control means inputs by the error control means of the CPU.

4. The digital processor system of claim 3 wherein said substitution control means further comprises;
   an N-cell register with inputs coupled to said second plurality of substitution control means inputs, wherein each of said N cells is permanently associated with one of said on-line memory modules, each of said cells having a pair of complementary outputs, the first of said pair for indicating the satisfactory performance of its associated on-line memory module, the second of said pair for indicating the unsatisfactory performance of its associated on-line memory module,
   a first set of N logical AND gates, each having a first input respectively coupled to each of said first plurality of substitution control means inputs and a second input respectively coupled to each of the first outputs of said register cells, the outputs of said first set respectively coupled to said first N outputs of said substitution control means, a second set of N logical AND gates, each having a first input respectively coupled to each of said plurality of substitution control means inputs and a second input respectively coupled to each of the second outputs of said register cells, and a logical OR gate having inputs respectively coupled to the outputs of said second set of N logical AND gates, the output of said logical OR gate coupled to said last one of said substitution control means outputs.

* * * * *